United States Patent [19]

Kanayama

[11] Patent Number: 4,475,174
[45] Date of Patent: Oct. 2, 1984

[54] DECODING APPARATUS FOR CODES REPRESENTED BY CODE TREE

[75] Inventor: Hideaki Kanayama, Yokohama, Japan

[73] Assignee: Nippon Telegraph & Telephone Public Corporation, Tokyo, Japan

[21] Appl. No.: 300,150

[22] Filed: Sep. 8, 1981

[51] Int. Cl.³ .......................................... H03K 13/24
[52] U.S. Cl. .............................. 364/900; 340/347 DD
[58] Field of Search ................................ 340/347 DD; 364/200 MS File, 900 MS File, 347 DD

[56] References Cited

U.S. PATENT DOCUMENTS

| | | | |
|---|---|---|---|
| 3,883,847 | 5/1975 | Frank | 364/900 |
| 3,918,047 | 11/1975 | Denes | 340/347 DD |
| 3,925,780 | 12/1975 | Van Voorhis | 340/347 DD |
| 4,044,347 | 8/1977 | Van Voorhis | 340/347 DD |
| 4,168,513 | 9/1979 | Hains et al. | 340/347 DD |
| 4,188,669 | 2/1980 | Rauscher | 364/900 |
| 4,215,422 | 7/1980 | McCray et al. | 364/900 |
| 4,236,206 | 11/1980 | Strecker et al. | 364/200 |

*Primary Examiner*—Gareth D. Shaw
*Assistant Examiner*—Tim A. Wiens
*Attorney, Agent, or Firm*—Pollock, Vande Sande & Priddy

[57] ABSTRACT

In an apparatus for decoding a variable length code represented by a code tree, a decoding table memory is read out and the read out data is decided as to whether it is terminal or intermediate data. In the case of a terminal data, its decoded result information in the data is delivered out. In the case of an intermediate data, its data of the same number of bits as indicated by information of the data indicating the number of bits to be entered is entered from an input code train; this data and information of the intermediate data for determining an address of the decoding table memory to be accessed are added together to obtain the address of the memory to be accessed next; the address thus obtained is used to access the decoding table memory; and this operation is repeated until a terminal data is obtained.

11 Claims, 21 Drawing Figures

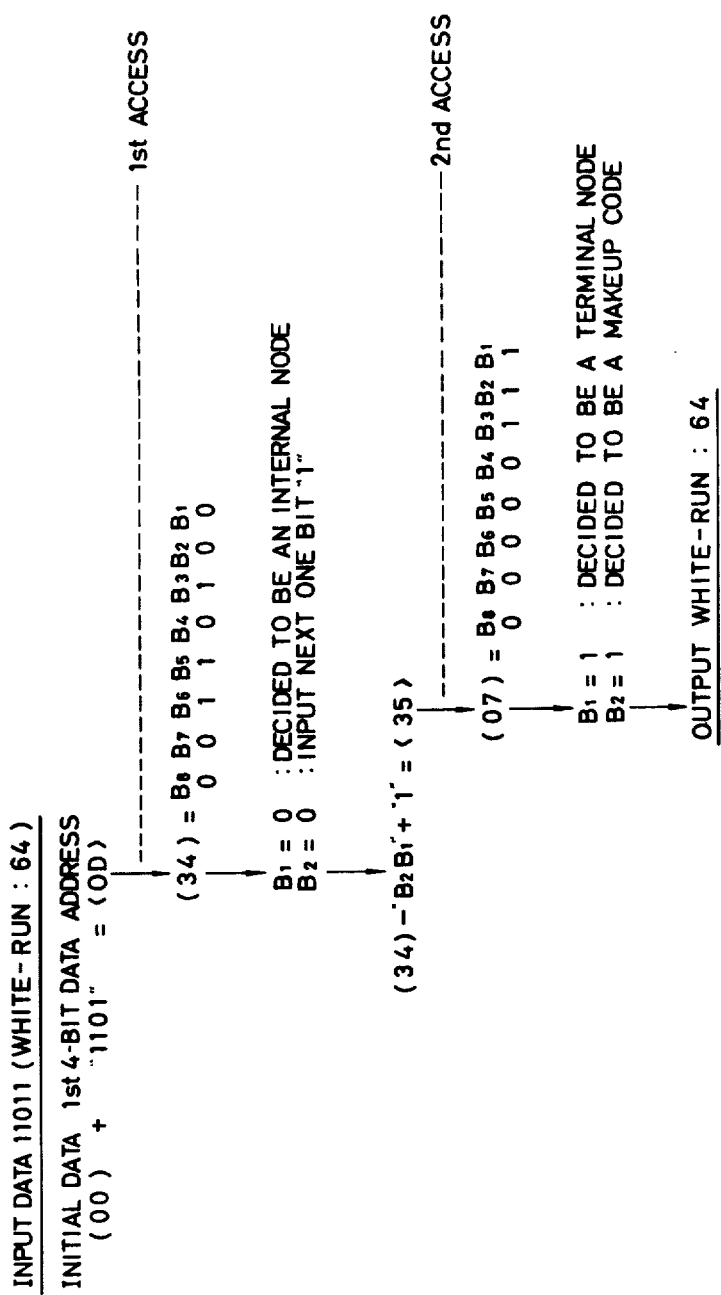

FIG. 16

| | | RELATIVE CAPACITY OF DECODING TABLE MEMORY | RELATIVE NUMBER OF ACCESS TIMES |
|---|---|---|---|
| PRESENT INVENTION | FIG. 7 EMBODIMENT | 1 | 1 |
| | FIG. 10 EMBODIMENT | 1.6 | 1 ~ 0.5 |
| PRIOR ART EXEMPLE OF FIGS 1 AND 2 | | 1.2 | 2 |
| PRIOR ART EXEMPLE OF FIG. 3 | | 3 ~ 100 | 0.5 |
| DECODE BASED ON CODETABLE | | 0.9 | 12 |

DECODING APPARATUS FOR CODES REPRESENTED BY CODE TREE

BACKGROUND OF THE INVENTION

The present invention relates to apparatus for decoding a variable length code represented by a code tree.

A known variable length code represented by a code tree is, for example, the modified Huffman code. This is obtained by encoding a black and white run length of scanned picture by the Huffman encoding scheme, as described, for example, in R. Hunter et al, "International Digital Facsimile Coding Standards", Proceeding of the IEEE, July 1980, Vol. 68, No. 7, pp. 854–867, Chapter IV entitled "One-Dimensional Coding Scheme". A conventional decoding method for this modified Huffman Code is to select one of two branches at each node in a code tree depending on whether "1" or "0" is detected for individual bits of the input code, ultimately arriving at a terminal node indicating a decoded result. To perform this, it is necessary to access a decoding table memory for each bit of the input data and to decide, for each memory output, whether the terminal node is reached or not. This increases the number of steps for processing, including the time-consuming steps of memory access and decision processing, resulting in the overall processing time becoming relatively long. Therefore, the abovementioned prior art decoding method is disadvantageous in that it can be realized only by the use of a high-speed microprocessor or wired logic circuit.

Though not intended for the code of facsimile, a method of increasing the decoding rate for the Huffman code is described in Frank U.S. Pat. No. 3,883,847 issued May 13, 1975, for "Uniform Decoding of Minimum-Redundancy Codes". With the decoding method of this patent, data of a predetermined number of bits is entered from an input code train to access a primary decoding table memory to read it out and, in the case where decoding is not completed by the readout, an address of a secondary decoding table memory to be accessed next is determined using the read out data and then the secondary decoding table memory is accessed by an input data of a plurality of bits entered next, thus obtaining a decoded result. This method raises the decoding rate but employs two decoding table memories, and hence has the defect that the overall storage capacity must be large.

It is an object of the present invention to provide decoding apparatus which is capable of high-speed decoding of a variable length code represented by a code tree without involving the bit-by-bit decoding operation and is small in the storage capacity of the decoding table memory used.

SUMMARY OF THE INVENTION

According to an aspect of the present invention, the decoding table memory has an area for storing terminal data and an area for storing intermediate data. The terminal data includes at least information indicating the completion of decoding and information indicating the result of decoding and the intermediate data includes at least information indicating incompletion of decoding, information indicating the number of bits to be entered next from an input code train and information on which is based the address of the decoding table memory to be accessed next. The decoding table memory is accessed and read out and it is decided by deciding means whether the data read out from the decoding table memory is terminal or intermediate data. In the case of terminal data, the information of the data indicating the result of decoding is delivered out from the decoding apparatus. In the case of intermediate data, the subsequent data is fetched from the input code train by a number of bits which is determined by the information of the intermediate data indicating the number of bits to be entered next, and the entered data and the information of the intermediate data for determining the address of the decoding table memory to be accessed next are operated to obtain the address to be accessed next and then the address of the decoding table memory is accessed. These operations are repeated until the terminal data is read out from the decoding table memory.

By determining from the read out data the number of bits of the code to be entered next and determining the address of the decoding table memory to be accessed next by operating the data entered by such a predetermined number of bits and the read out information, it is possible to decode a code of a plurality of bits at one time without the necessity of selecting one of two branches at each node in the code tree and to reduce the number of repetitions of accessing to the decoding table memory, thus permitting high-speed decoding. Further, the same decoding table memory is accessed repeatedly, and hence it can be effectively utilized and its memory size can be made small. Moreover, when decoding of one code is completed, a first bit of the input code train indicates the leading bit of the next code.

According to another aspect of the present invention, the terminal data in the decoding table memory includes information indicating the completion of decoding, information indicating the result of decoding and information indicating the number of bits to be entered next, and the intermediate data includes information indicating incompletion of decoding and information on which is based the address of the decoding table memory to be accessed next. After the decoding table memory is read out, it is determined by deciding means whether the read out data is terminal or intermediate data. In the case of terminal data, the information of the data indicating the result of decoding is outputted and the subsequent data is fetched in from an input code train by the number of bits specified by the information of the read out data indicating the number of bits to be entered next. In the case of intermediate data, the subsequent data is fetched in from the input code train by a fixed number of bits m (m being an integer 2 or more), and the entered data and the information of the read out data for determining the address of the decoding table memory to be accessed next are operated, and then the result of the operation is used to access the decoding table memory. These operations are repeated to decode the codes of the input code train one after another. The number of bits to be entered next in the terminal data is given by $L-(n-1) \cdot m$, where L is a decoded code length and n is the number of repetitions of accessing to the decoding table memory.

BRIEF DESCRIPTION OF THE DRAWINGS

FIG. 4 (i.e.

FIG. 6 is a diagram showing the steps of decoding an input code "11011" indicative of a white run length 64 through the use of the decoding table illustrated in FIG. 4;

FIG. 13 (i.e.

FIG. 16 is a table showing the relationships between the decoding table memory capacities and the access times required in each decoding apparatus, in the case where the decoding table memory capacity and the memory-access times needed in the first embodiment of the present invention are each represented by 1.

DESCRIPTION OF THE PRESENT EMBODIMENTS

Figure 1:
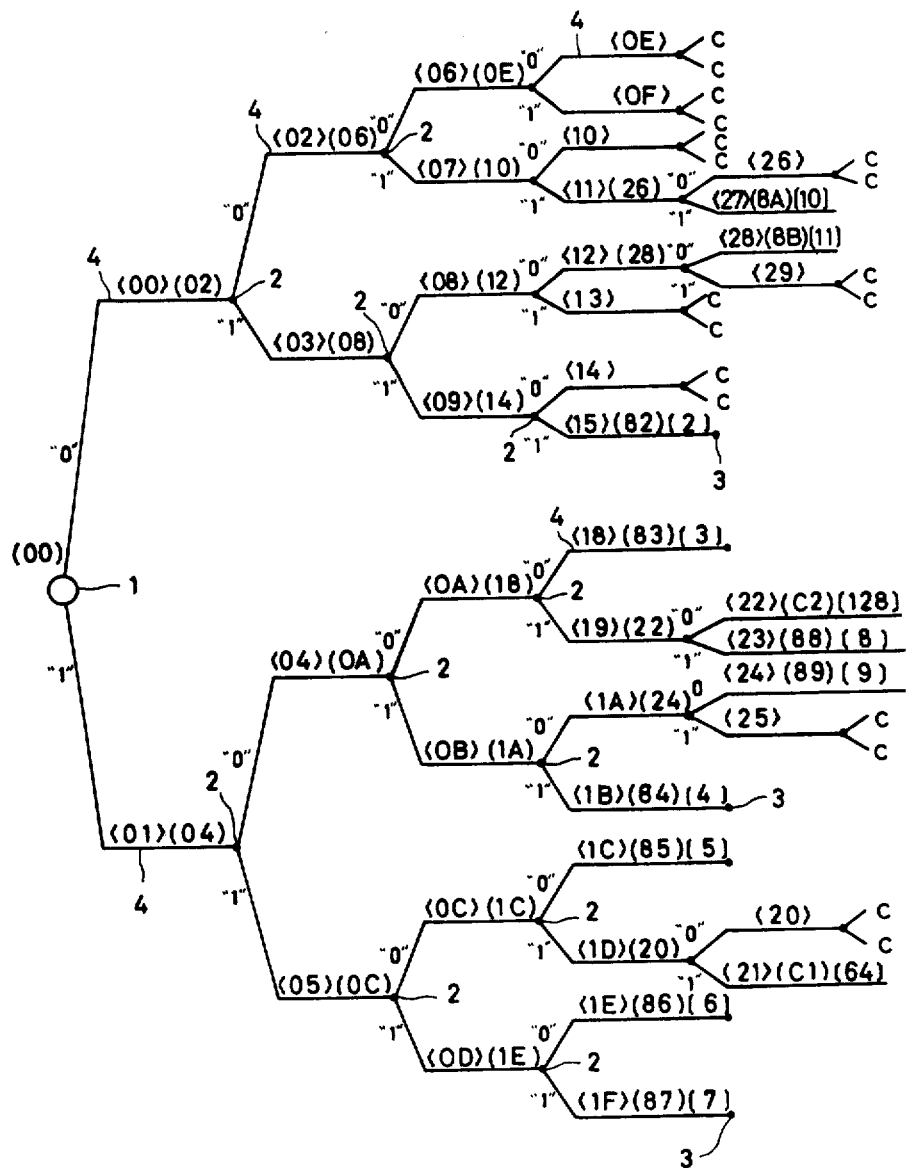
FIG. 1 is a diagram showing a part of a decoding table of the modified Huffman code by a conventional bit-by-bit decoding method using a code tree.

To facilitate a better understanding of the present invention, a description will be given first of the conventional bit-by-bit decoding method. FIG. 1 shows a part of a white code tree of the modified Huffman code based on the conventional bit-by-bit decoding method, the code tree constituting a decoding table. A root 1 is divided into two branches 4, each of which arrives at a node 2. The node 2 is subdivided into two branches 4, each of which is further subdivided into two branches 4 at each node 2. In this way, terminal nodes 3 are reached. Shown above the branch 4 at each node 2 before being divided are an address <XX> of the decoding table and a decoding table data (XX) or a run length [XX]. The X's of these address and data assume any of 0, 1, 2, 3, ... 9, A, B, C, D, E and F; namely "XX" represents two digit hexadecimal numbers. In the case of the run length, however, the X indicates a decimal number. A small letter "c" indicates a further extension of the code tree.

Figure 2:
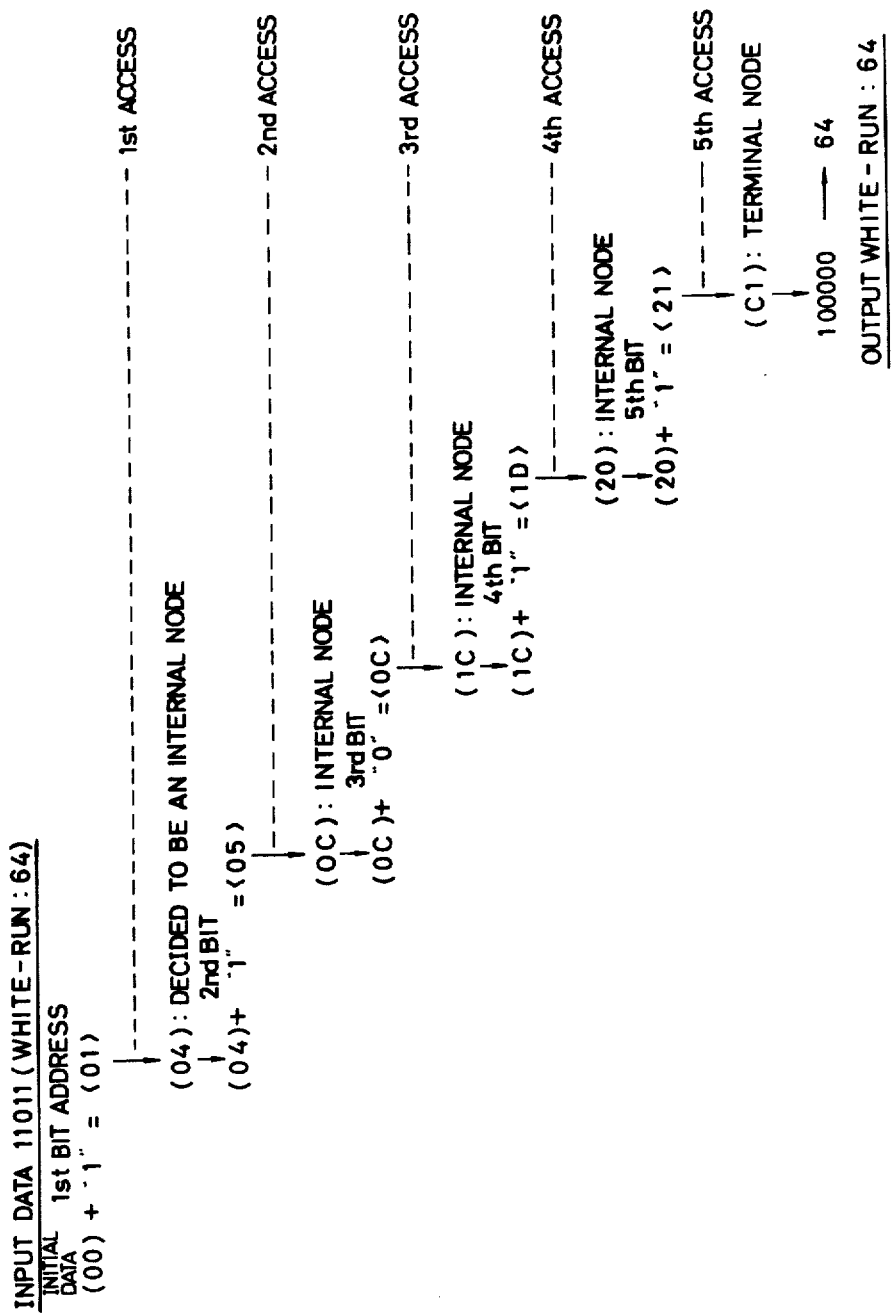
FIG. 2 is a diagram showing the steps of decoding an input code "11011" indicative of a white run length 64 by the use of the decoding table depicted in FIG. 1.

FIG. 2 shows an example of the decoding of a code "11011" representing a white run length 64, which is entered as an input code train (data train) into the decoding table of FIG. 1. The decoding procedure starts with the preparation of (00) as initial data. The first bit "1" of the input data is entered, which is added to the initial data (00) to obtain a jump address <01>. A data (04) of the jump address is read out. From the data (04) it is checked whether a terminal node of the code tree has been reached or not. The data ($X_2=0$, $X_1=4$) are respectively represented as binary numbers and whether a terminal node has been reached or not is decided depending on whether the most significant bit (MSB) of "$X_2X_1$", that is, "00000100" is "1" or "0". In this case, since the most significant bit (MSB) is "0", it is decided that the terminal node has not been reached (In the case where the most significant bit is "1", it is decided that the terminal node has been reached). Then the next bit "1" of the input data is added to the data (04) to obtain a jump address <05>. In this way, one of two branches is selected for each node 2 depending on whether each one-bit data is "0" or "1". Thereafter, the access to the decoding table, the decision on the terminal node and the formation of a jump address are similarly repeated upon each application of one bit of the input data, thereby ultimately arriving at the terminal node.

Thus an address <21> is reached and its data (C1), i.e. "11000001" is read out. Since the most significant bit of this data is "1", it is decided that the terminal node has been reached, and the run length is decoded using the data (C1) of this terminal node. That is, the data of the bit next to the most significant bit of the data (C1=11000001) indicates a terminating code or makeup code. In the case where this bit is "1", it indicates the makeup code and the run length is obtained by multiplying 64 by a number of the lower-order six figures, that is, "000001" (a binary number) =1 (a decimal number) in this case. When the data of the bit second from the most significant one of the read out data is "0", it indicates the terminating code and the value of the lower-order six bits of the data indicates the run length. In the prior art it is necessary to access the decoding table for each bit of data and to make a decision on the data as described above. This inevitably results in the decoding rate being reduced.

Figure 3:
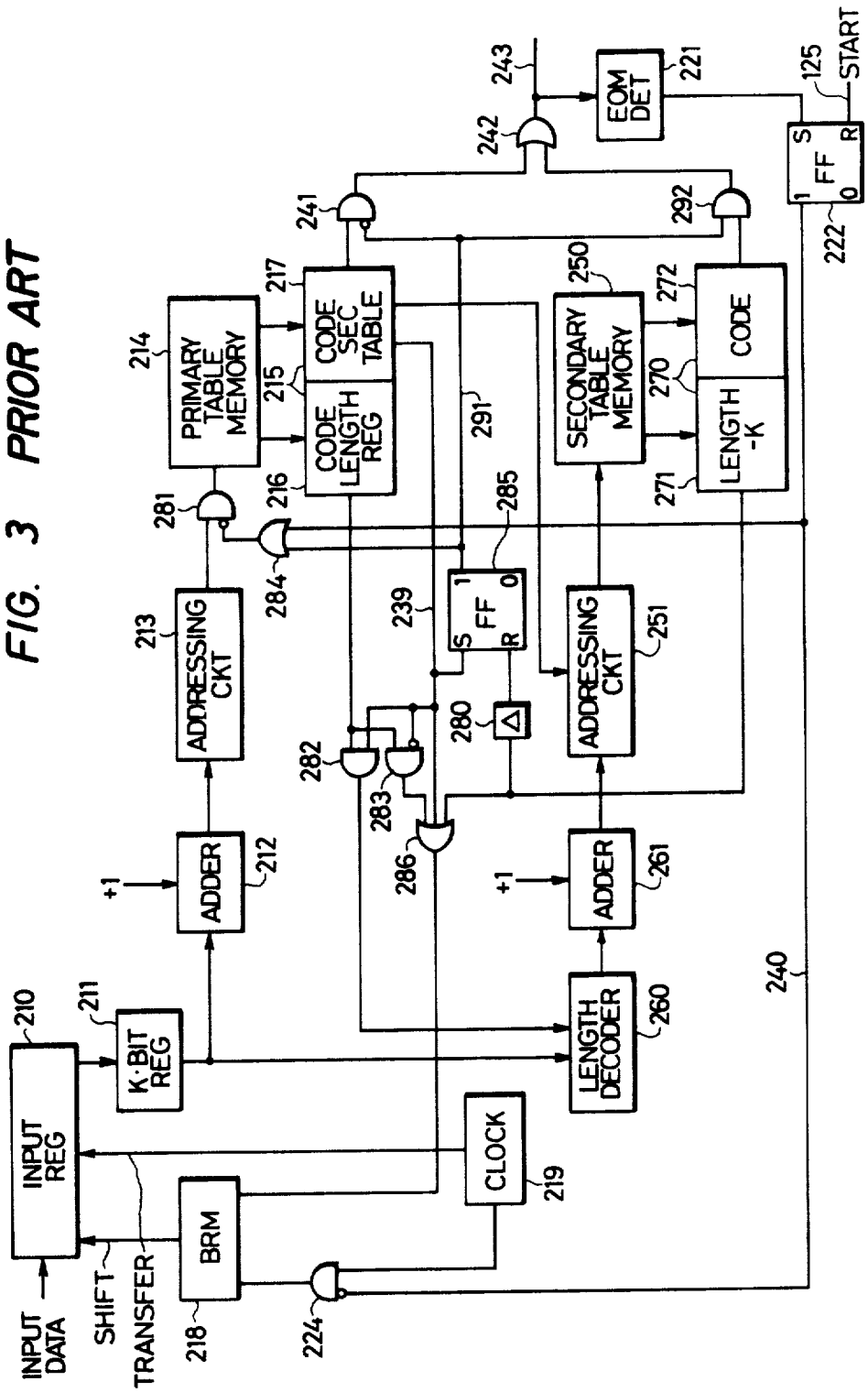
FIG. 3 is a block diagram illustrating a decoding apparatus disclosed in U.S. Pat. No. 3,883,847.

A brief description will be given, with reference to FIG. 3, of a decoding method set forth in U.S. Pat. No. 3,883,847. Input data is entered into an input register 210, from which only K bits of the input data are transferred to a register 211. The K-bit data thus applied to the register 211 is incremented by 1 in an adder 212, the output from which is used as an address to access a primary table memory 214 via an addressing circuit 213 and an inhibit gate 281. When data from the memory 214 is a decoded result, the decoded code is delivered from a register 217 to an output lead 243 by way of an inhibit gate 241 and an OR gate 242. Further, the number of bits used in the entered K-bit data is provided from a register 216 to a binary rate multiplier 218 via an inhibit gate 283 and an OR gate 286. The input register 210 is controlled by the binary rate multiplier 218 corresponding to the number of bits used thereby to enter the corresponding amount of input data into the register 211.

On the other hand, in the case where the K bits of the data entered into the register 211 do not constitute one code, the register 217 yields a signal indicating no provision of a decoded result when the primary table memory is accessed. By this signal the inhibit gate 283 is inhibited and a flip-flop 285 is set. The output from the flip-flop 285 is provided to the inhibit gates 241 and 281 to inhibit them. Further, the output from the register 217 is applied via the gate 286 to the multiplier 218 to drive it, entering the K bits of the input data into the register 211 via the register 210. Unnecessary bits in the data of the register 211 are masked by the output from the register 216 in a decoder 260 to take out required A bits. The output from the decoder 260 is incremented by 1 in an adder 261 and the added result is used as an address to access a secondary table memory 250 via an addressing circuit 251. In this case, the addressing circuit 251 is controlled by the output from the register 217 to determine which one of tables of the secondary table memory 250 is accessed. When the memory 250 is read out, the decoded result is delivered from a register 272 to the output lead 243 via gates 292 and 242 and the number of bits used for decoding is supplied from a register 271 to the multiplier 218 via the gate 286. Upon detection of the end of the input data by a detector 221, a flip-flop 222 is set and its output is provided to an inhibit gate 224 to close it, stopping this decoding apparatus from operation.

The decoding apparatus of the abovesaid United States patent is of the type that accesses the primary table memory 214 using plural bits of the input data and does not check for each bit whether it is decoded or not; hence, the number of memory accesses required is small to permit high-speed decoding. This apparatus, however, calls for the provision of the first and second table memories 214 and 250, resulting in an increased memory size in terms of the number of bits or words.

Figure 4A:
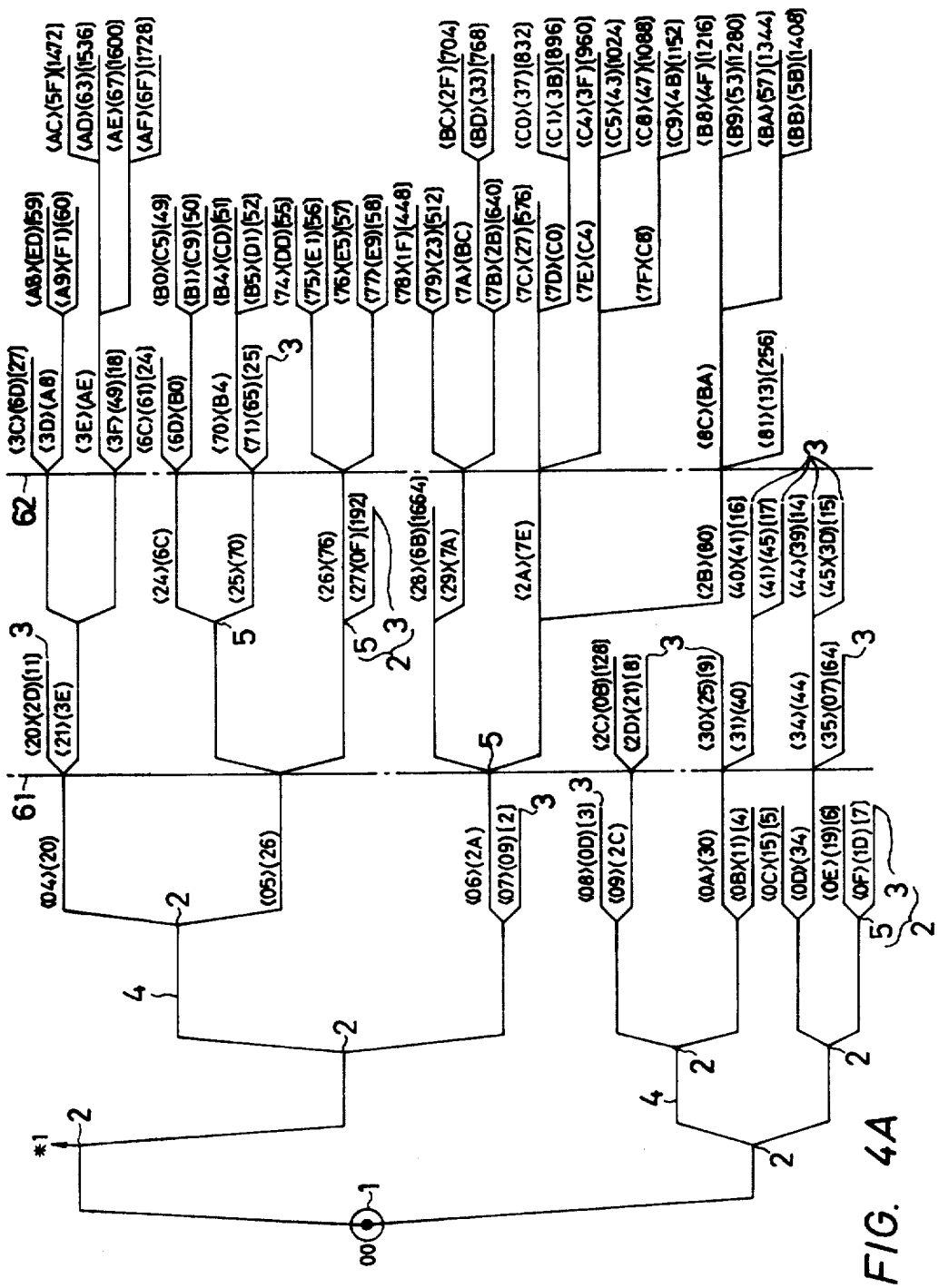
FIGS. 4A and 4B) is a diagram illustrating an example of a decoding table for white codes which is employed in the decoding apparatus of the present invention.
Figure 4B:
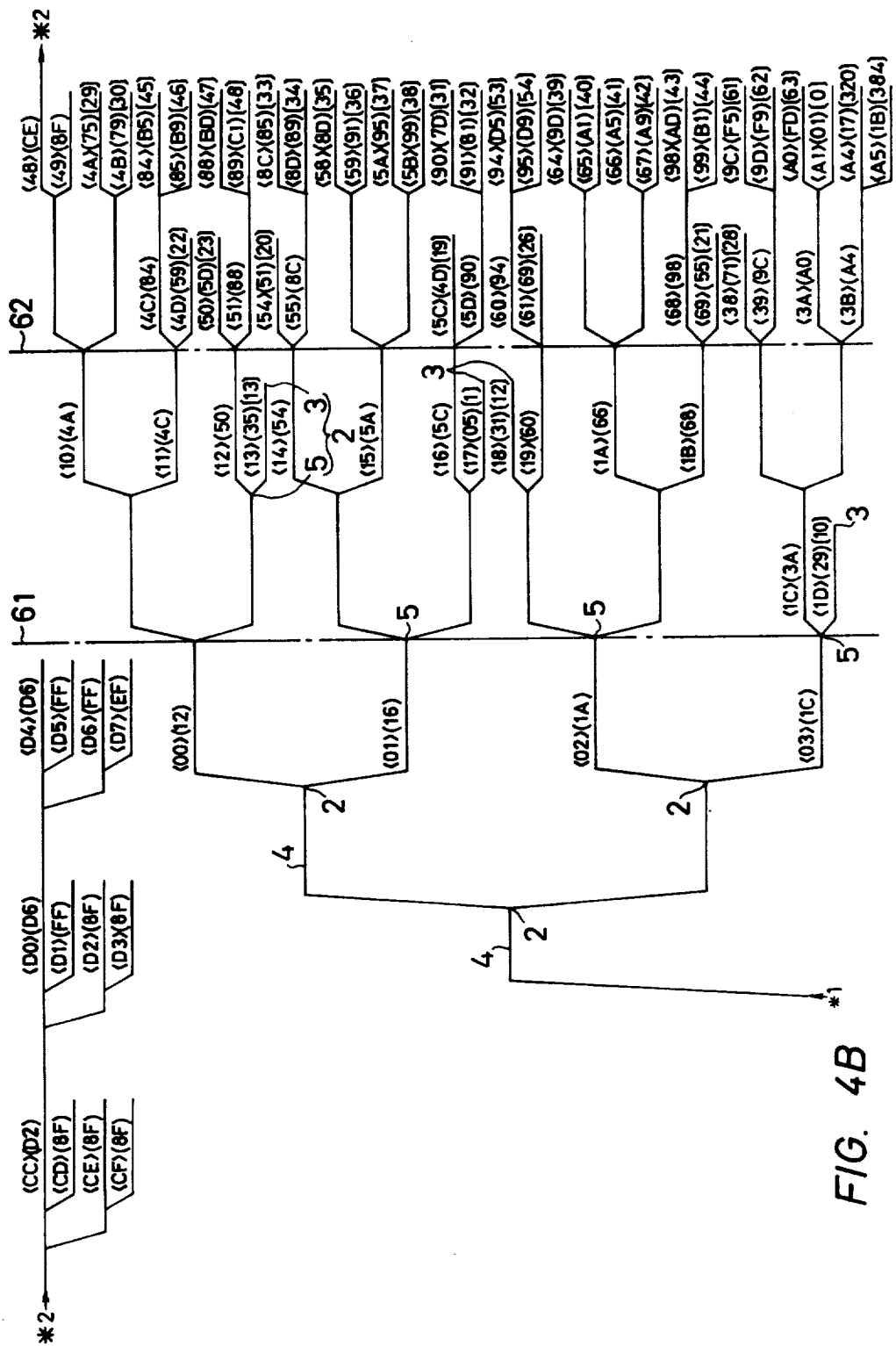

FIG. 4 illustrates an example of a decoding table for use in the decoding apparatus of the present invention; this is a decoding table using a white code tree of the modified Huffman code. In this case, the data length (XX) is eight-bit, the memory address <XX> is eight-bit and the number of branches to be selected at a time, that is, the number of code bits to be decoded at a time is 1, 2 or 4. It is a matter of course that the data length, the length of the memory address and the number of branches to be selected at a time are arbitrary. Also the number of branches to be selected at a time may be fixed or limited specifically to, for example, two. Reference numerals 1 to 4 are identical with those used in FIG. 1 but a data in the course of decoding is indicated by an internal node 5. Here, the number of branches to be chosen at a time is so selected as not to exceed the number of branches 4 from the root 1 or the internal node 5 to the nearest terminal node 3. Namely, in FIG. 4 the nearest terminal nodes 3 from the root 1 are those of addresses <07>, <08>, <0B>, <0C>, <0E> and <0F> which are located on the fourth branches from the root 1. Examining the internal nodes immediately to the left of the line 61, for example, an address <03> reaches the nearest terminal node 3 at an address <1D> which is a branch next to the address <03> and the number of branches selected is one. In the case of an address <00>, however, there is no terminal node until a second branch, that is, a branch immediately to the left of a line 62, for example, as an address <13> is reached. Therefore, the number of branches selected from the address <00> to the nearest terminal node thereto is two. Data (FF) and (EF) indicate a line synchronizing signal EOL and data (8F) a decoding error.

Figure 5A:
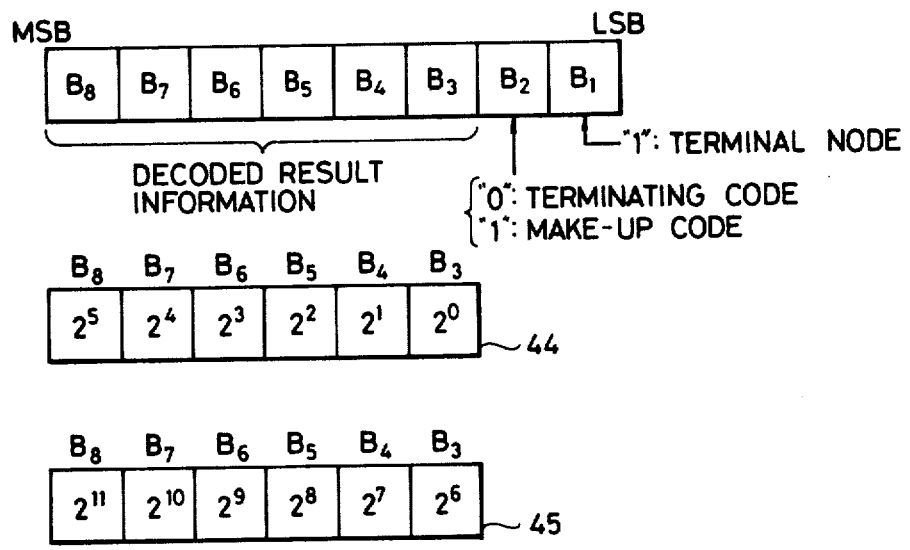
FIG. 5A shows an example of the data format of terminal data.

The data (XX) is stored in each address <XX> of a decoding table memory following the decoding table of FIG. 4. [XX] indicates the run length and in this case X is a decimal number. The decoding memory has an area for storing terminal data and an area for storing intermediate data. In this embodiment the decoding table memory is made of 8-bit words and the terminal and intermediate data are each eight-bit. The format of the terminal data depicted in FIG. 5A. When the least significant bit $B_1$ is "1", it indicates a terminal node 3, that is, terminal data. The bit $B_2$ next to the least significant bit $B_1$ indicates the kind of the decoded code; in this example, it indicates whether the decoded result is a terminating code or makeup code. The six bits $B_3$ to $B_8$ are information indicating the decoded result, i.e. the run length. When the bit $B_2$ is "0", the decoded result information is the terminating code and, as indicated by reference numeral 44, the bits $B_3$ to $B_8$ are given weights $2^0$ to $2^5$, respectively. When the bit $B_2$ is "0", the decoded result information is the makeup code and, as indicated by reference numeral 45, the bits $B_3$ to $B_8$ are given weights $2^6$ to $2^{11}$, respectively.

Figure 5B:
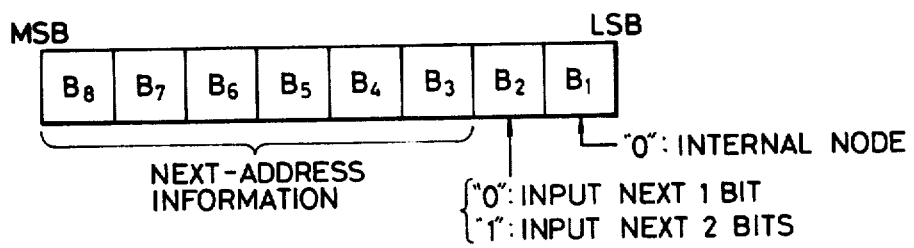
FIG. 5B shows an example of the data format of intermediate data.

The format of the intermediate data is depicted in FIG. 5B. When the least significant bit $B_1$ is "0", it represents the internal node 5, namely, it indicates that the data is an intermediate one in the course of decoding. The second bit $B_2$ indicates the number of bits to be entered next from the input code train. When the bit $B_2$ is "0", one bit is entered and when the bit $B_2$ is "1", two bits are entered. The bits $B_3$ to $B_8$ represent information for determining the address of the decoding table memory to be accessed next.

FIG. 6 illustrates an example of decoding in the case where "11011" indicating the white run length 64 is entered as input data into the decoding table of FIG. 4. The decoding operation of this case will be described with reference to FIG. 6. As initial data, (00) is prepared. As referred to previously, the number of branches to be selected first, that is, the number of bits to be entered at the start of decoding each code, is four and four bits "1101" ("0D" in the hexadecimal system) of the input data are added to the initial data (00) to obtain a jump address <0D>. From the jump address is read out its data (34). By detecting the least significant bit $B_1$ of the binary representation "00110100" of this data, it is decided whether a terminal node 3 of the code tree has been reached or not. Since the least significant bit $B_1$ is "0", this data is an intermediate one and its decoding has not been completed. From the second bit $B_2=0$ of the binary representation of the read out data (34) it is decided that the number of branches to be selected next is one. Then the next one bit "1" of the input data is entered and it is added to data in which the bits $B_1$ and $B_2$ of the read out data (34) have been made "0", thereby obtaining a jump address <35>. From the jump address is read out its data (07). Since the least significant bit $B_1$ of the binary representation "00000111" of the data is "1", it is decided that a terminal node of the code tree has been reached. From the bit $B_2=1$ of the read out data it is decided that the data is the makeup code. So the decoded result information $B_8B_7...B_3=000001$ means a run length of 64 which is derived by multiplying the decoded result ("1" in decimal number) by 64.

Figure 7:
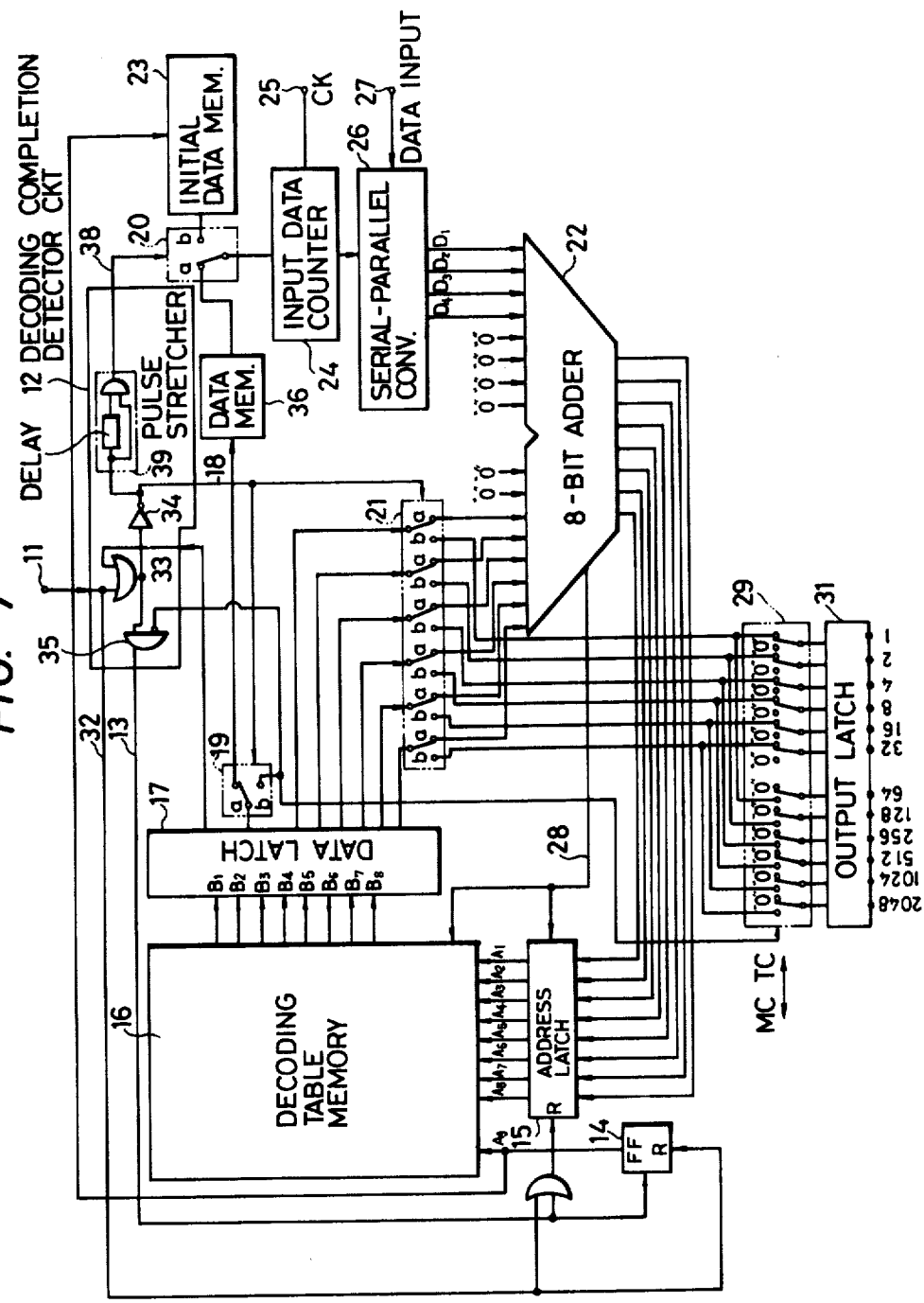
FIG. 7 is a block diagram representation of an example of the decoding apparatus of the present invention employing the decoding table of FIG. 4.

FIG. 7 illustrates a wired logic embodiment of the decoding apparatus of the present invention based on the example of the decoding table of the modified Huffman code shown in FIG. 4. The operation of this apparatus will hereinbelow be described in connection with the case where the input data "11011" is entered as in the case of FIG. 6. For starting the decoding operation, a decoding start signal is provided as a high level "1" from a lead 11 to a decoding completion detector circuit 12, for example, for a certain period of time. By rise-up of the output from an output signal line 32 of the detector circuit 12, a toggle flip-flop 14 indicating whether the input data is white or black data is reset to prepare for decoding of a white code and, at the same time, a memory address latch 15 is reset. For Modified Huffman coding scheme, the decoding operation of a facsimile code starts with a white code. A memory address from the latch 15 is used to read out a memory 16 having stored therein the decoding table of FIG. 4 and the read out initial data (00) is delivered to a data latch 17. In the decoding completion detector circuit 12 the aforesaid decoding start signal provides a low level on an output line 18 via an OR gate 33 and an inverter 34. At the same time, the output from the inverter 34 yields a low level on an output line 38 via a pulse stretcher circuit 39 composed of a delay circuit and an AND gate. By these levels data selectors 19, 20 and 21 are respectively connected to the side b thereof. By the above operation the data selector 20 is connected to an initial data memory 23 immediately after starting the decoding operation. The initial data memory 23 is controlled by an output "0" (indicating white-code decoding) from the flip-flop 14 to set a value 4 in an input data counter 24 via the selector 20. Input clocks from a terminal 25 are applied to the counter 24 and, in synchronism with this, a four-bit input data "1101" is entered into an input data serial-parallel converter circuit 26 from a lead 27. Thereafter the input data "1101" is provided from the serial-parallel converter circuit 26 to an eight-bit adder circuit 22, after which the input data serial-parallel converter circuit 26 is reset. That is, its input status is made "0000" while holding its outputs unchanged, that is, "1101". In this while, the least significant bit $B_1=0$ of the initial data (00) read into the data latch 17 as described previously is applied to the decoding completion detector circuit 12 to provide a high level on the output line 18 via the OR gate 33, switching the selectors 19 and 21 to their side a. As a result of this, the bits $B_8$ to $B_3$ of the initial data (00) are applied from the latch 17 to the eight-bit adder 22 via the selector 21. This initial data (00) and the input data "1101" from the serial-parallel converter circuit 26 are added in the eight-bit adder circuit 22 to obtain a jump address <0D>. The selector 20 is changed over to its side a by the pulse stretcher circuit 39 after the changeover of the selectors 19 and 20, that is, after outputting the jump address <0D>.

The jump address <0D> is delivered to the memory address latch 15. The memory 16 is accessed by the read signal on a signal line 28 to read out the data (34) corresponding to the jump address <0D>, which is provided to the data latch 17. Accordingly, in this case, $B_1=0$ and $B_2=0$. Since the least significant bit $B_1$ is "0", this data is not a terminal data but an intermediate data. Accordingly, the data selectors 19 to 21 are held on their side a by the decoding detector circuit 12. The bit $B_2=0$ is provided as an address to a next data memory 36 to read the content "1", which in turn is set in the input data counter 24 via the selector 20. In consequence, the next one bit "1" of the input data from the lead 27 is entered into the input data serial-parallel converter circuit 26 in synchronism with the input clock. The output from the input data serial-parallel converter circuit 26 becomes "0001" and the input to the eight-bit adder circuit 22 becomes (01). The bits $B_8$ to $B_3$ of the output (34) from the data latch 17 are applied to the eight-bit adder circuit 22. By the eight-bit adder circuit 22 (01) and (34) - "$B_2B_1$" are added to obtain a jump address <35>, which is delivered to the memory address latch 15. From the address <35> of the memory 16 is read out a data (07), which is provided to the data latch 17. Therefore, the bits $B_1$ and $B_2$ both become "1".

Since the least significant bit $B_1$ is "1", it is detected by the decoding completion detector circuit 12 that the data is terminal data, that is, a terminal node has been reached, and by the detected output, the data selectors 19 to 21 are switched to their side b. Since the bit $B_2$ is "1", a data selector 29 is switched to the MC side and the bits $B_8$ to $B_3$ in the data latch 17 are applied to higher-order six bits of a run length output latch. As a result of this, "000001000000", i.e. the run length "64" is outputted, completing the decoding operation. In the modified Huffman coding scheme, when a run length is longer than 63, the run length is represented by a combination of a makeup code and a terminating code. For example, a white run 80 is represented by a white run 64 + a white run 16. Accordingly, the decoding for a makeup code is always followed by a terminating code of the same color as the preceding one, which is accomplished in the decoding apparatus of the present invention such that the decoded result of the makeup code, i.e. the terminal data, always produces "1" at the bit second to the least significant bit $B_1$, and the bit $B_2=1$ of the terminal data is supplied to the decoding completion detector circuit 12 to inhibit its inhibit gate 35. Therefore the least significant bit $B_1=1$ is provided to the gate 33 and the decoding operation for the next code begins with the white code. In the case of the white run 64 as explained before, the data is decoded in the form of white run 64 + white run 0. In the case where the decoded data is a terminating code, the bit $B_2$ of the terminal data is "0" and the bit $B_1=1$ is provided via the inhibit gate 35 to the flip-flop 14 to invert it, changing readout of the decoding table memory 16 from the white code decoding table to a black code decoding table and vice versa. At the same time, the memory address latch 15 is reset to decode the next input data in the same manner as in the case of the input data "11011".

Figure 8:
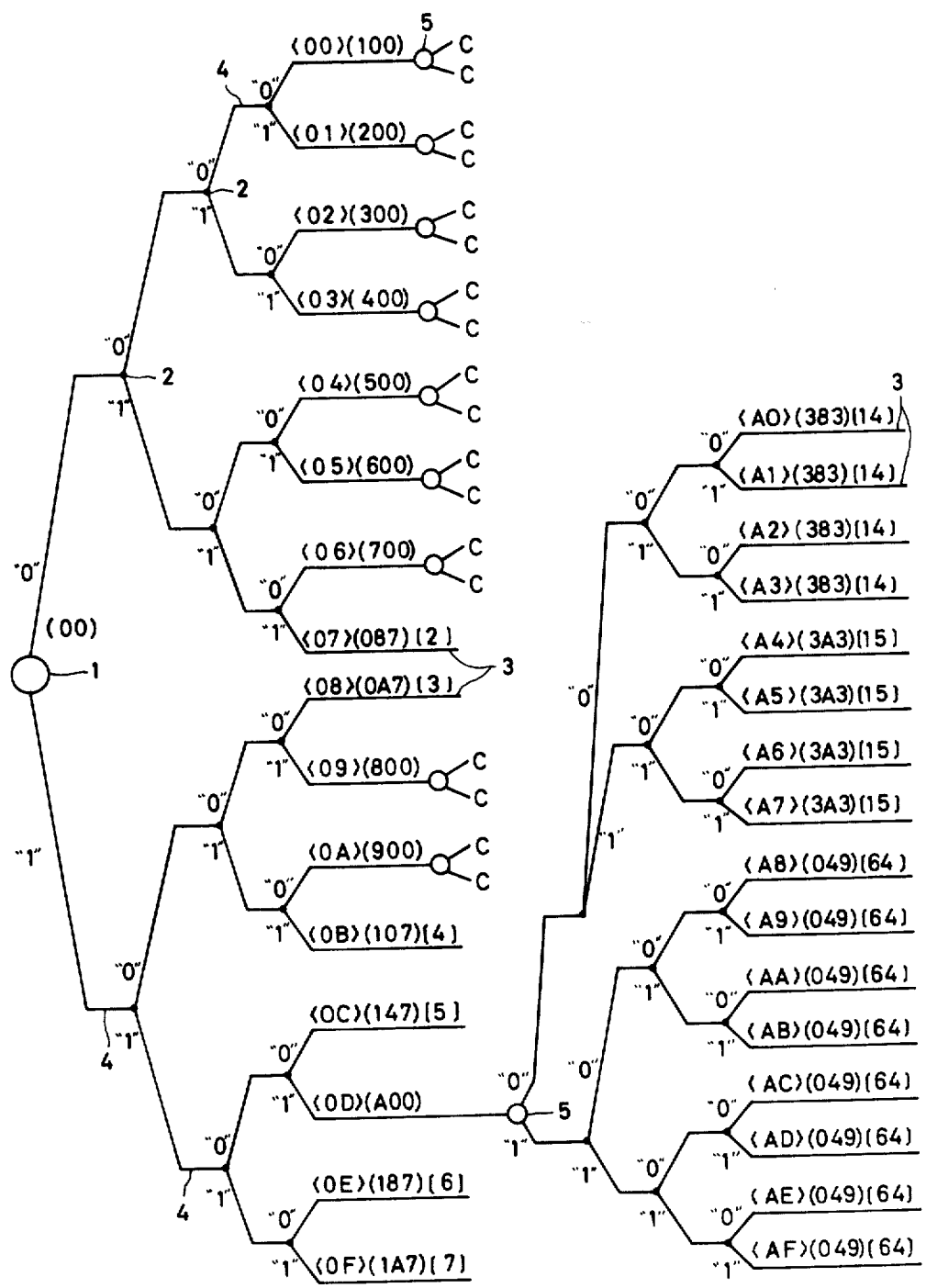
FIG. 8 illustrates an example of a part of the decoding table for white codes for use in another embodiment of the decoding apparatus of the present invention.

FIG. 8 shows a part of the decoding table of the modified Huffman code in another embodiment of the decoding apparatus of the present invention. In FIG. 8 the parts corresponding to those in FIG. 4 are identified by the same reference numerals. In this case, the data length is 10-bit, the memory address is eight-bit and the number of branches to be selected at a time, that is, the number of bits of an input data to be entered next in the case of unfinished decoding, is fixed to be four. Also in this case, X is one digit of a hexadecimal number and if the bit assignment in the case of each digit of the data (XXX) being converted into the binary representation is selected to be ($B_{10}B_9B_8B_7B_6B_5XXB_4B_3B_2B_1$), then the bit $B_1$ indicates the end or continuation of the decoding operation; the bits $B_2$ and $B_3$ indicate the number of initial data bits to be entered next at the end of the decoding operation, that is, when read out data is a terminal data; the bit $B_4$ indicates whether the data decoded is a makeup or terminating code at the end of the decoding operation; and the bits $B_5$ to $B_{10}$ indicate address data in the case of intermediate data and indicate the decoded result in the case of terminal data. "X" is "1" or "0" and this is not utilized for the decoding operation.

Figure 9:
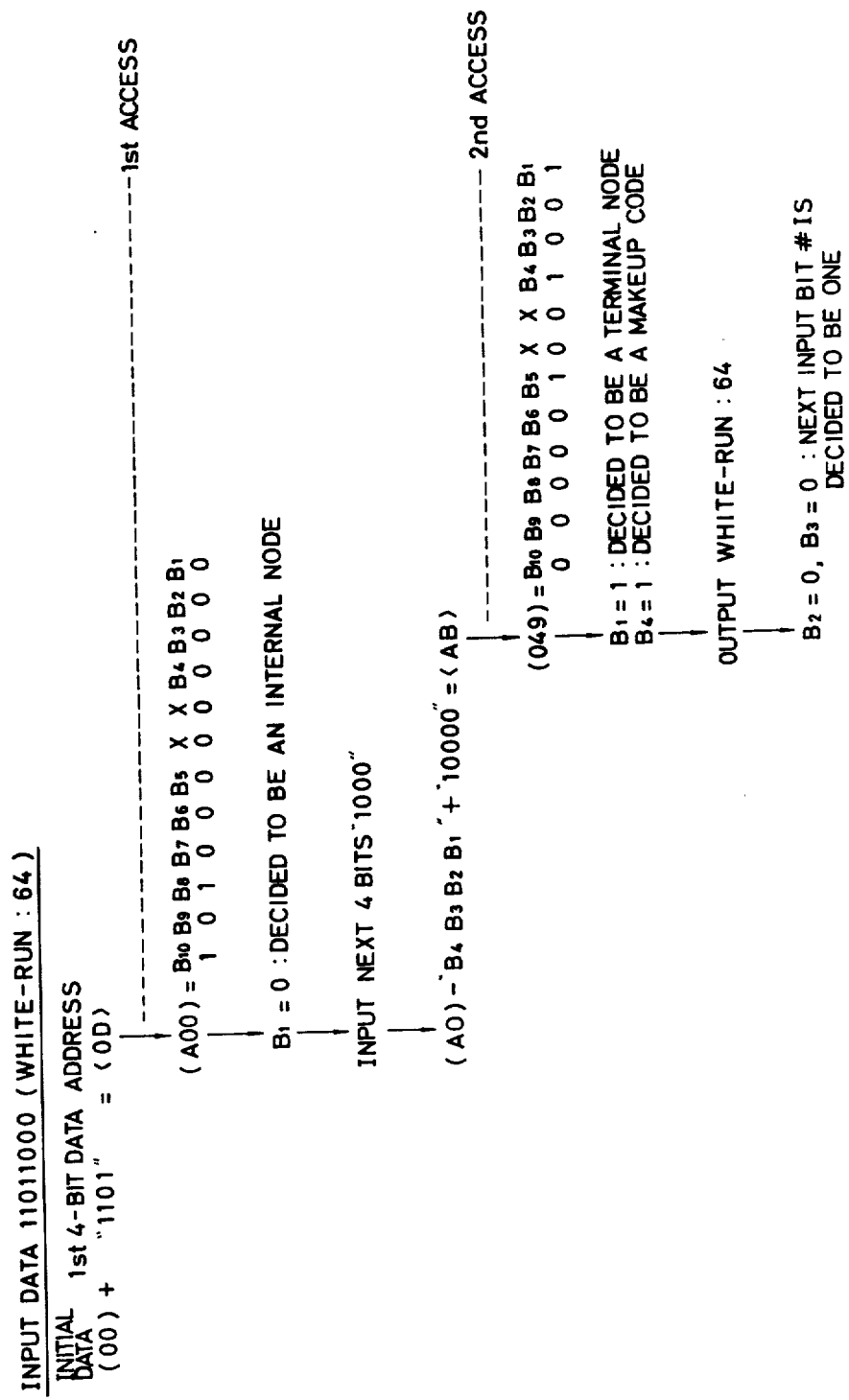
FIG. 9 is a diagram showing the steps of decoding an input code "11011" representative of a white run length 64 through utilization of the decoding table of FIG. 8.

FIG. 9 shows an example of the decoding operation in the case where the decoding table of FIG. 8 is employed and the data "11011" indicating the white run length 64 is entered as input data. This operation will be described later.

Figure 10:
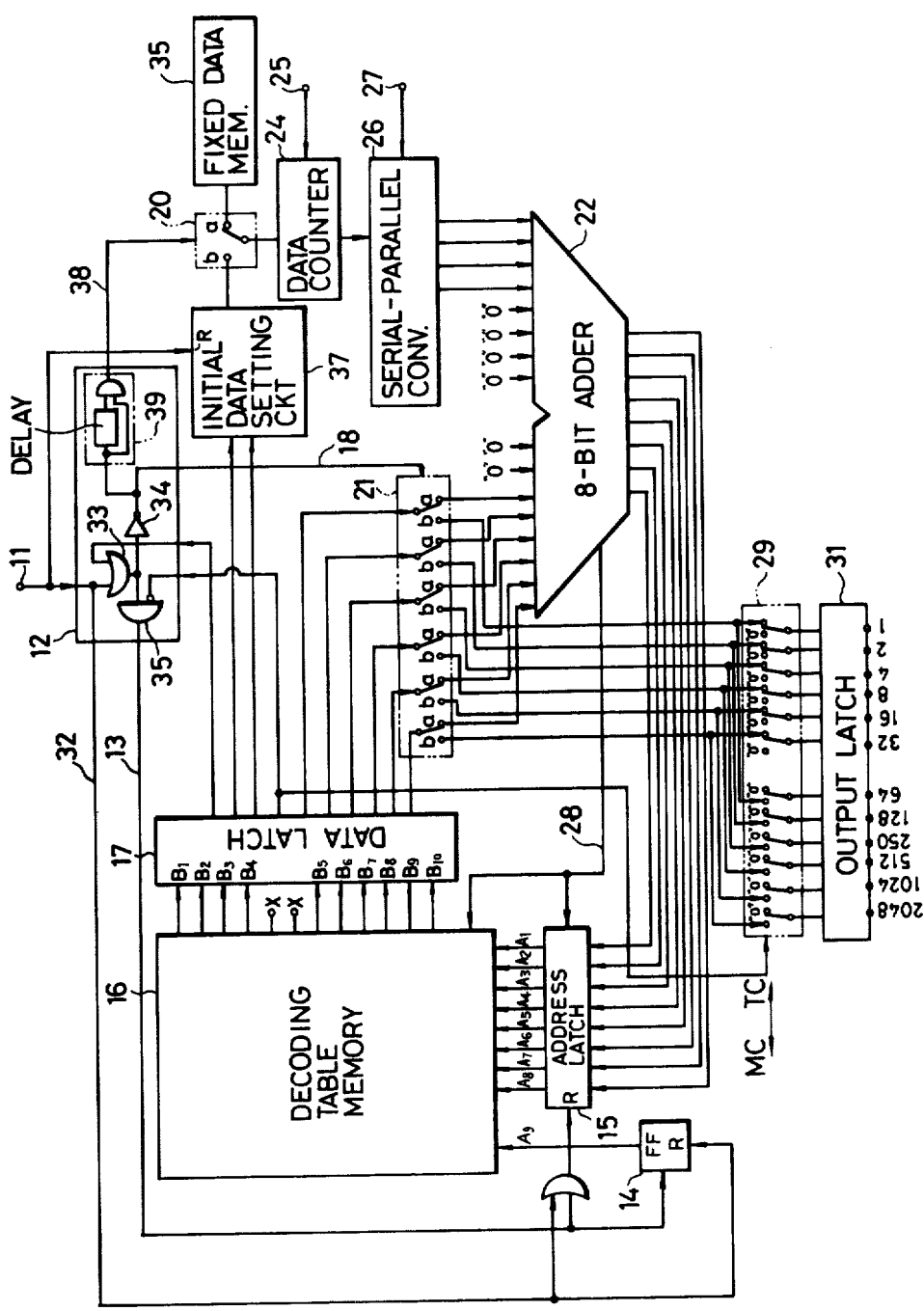
FIG. 10 is a block diagram representative of another embodiment of the decoding apparatus of the present invention employing the decoding table of FIG. 8.

FIG. 10 illustrates another wired logic embodiment of the decoding apparatus of the present invention which employs the modified Huffman code decoding table shown in FIG. 8. In FIG. 10 the parts corresponding to those in FIG. 7 are identified by the same reference numerals. The data selector 20 selects whether the value of the input data counter 24 is set to a fixed number of input data from a fixed bit number setting memory 35 or the number of data from an initial bit number setting circuit 37. The initial bit number setting circuit 37 sets the number of initial input data for a code to be decoded next from the output data $B_2$ and $B_3$ in the data latch 17 and this number is not fixed. The fixed bit number setting memory 35 is used to enter a fixed number of input data in the course of decoding.

The operation of the apparatus shown in FIG. 10 will be described in respect of the case of an input data "11011000" depicted in FIG. 9 being entered. For starting the decoding operation, a decoding start signal is applied via the lead 11 to the decoding completion detector circuit 12 to reset the flip-flop 14 via the signal line 32, putting the decoding table memory 16 in the white code readout state. At the same time, the memory address latch 15 is also reset to output a data (000) from the memory 16 to the data latch 17. On the other hand, the decoding completion detector circuit 12 provides low levels on the output lines 18 and 32 by the decoding start signal to switch the data selectors 20 and 21 to their side b as in the case of FIG. 7. By this operation the data selector 20 is connected to the initial bit number setting circuit 37. The initial bit number setting circuit 37 is reset by the decoding start signal to set an input count data "4" in the input data counter 24. The first four bits "1101" of the input data are applied to the input data serial-parallel converter circuit 26 from the lead 27 in synchronism with the input clock pulses from the terminal 25. The entered data can be represented by (0D) in the hexadecimal notation. Thereafter the input data serial-parallel converter circuit 26 delivers the input data "1101" to the eight-bit adder circuit 22. In this while, the least significant bit $B_1 = 0$ of the initial data (000) read out into the data latch 17 is applied to the decoding end detector circuit 12 to provide a high level on the output line 18 via the OR gate 33, switching the selector 21 to its side a. Consequently the bits $B_{10}$ to $B_5$ of the initial data (000) are entered from the data latch 17 into the eight-bit adder circuit 22 via the data selector 21. The input data "1101" i.e. (0D) and the initial data (00) i.e. (000) - "$B_4B_3B_2B_1$" are added to obtain a jump address <0D>, which is delivered to the memory address latch 15. The data selector 20 is caused by the pulse stretcher circuit 39 to be switched to its side a behind after the data selector 21, that is, after outputting the jump address <0D>. By the signal provided on the signal line 28 from the eight-bit adder circuit 22, a data $(A00)(B_{10}B_9B_8B_7B_6B_5XXB_4B_3B_2B_1 = $ "101000000000" by binary representation) corresponding to the jump address <0D> is read out from the decoding table memory 16 into the data latch 17. This data is intermediate data for an internal node because the least significant bit $B_1$ is "0". By the decoding completion detector circuit 12 the data selectors 20 and 21 are held "unfinished" (on their side a).

Consequently "4" is set by the fixed bit number setting memory 35 in the input data counter 24 and four bits "1000" of the next input data are entered into the input data serial-parallel converter circuit 26 in synchronism with the input clock pulses. The output from the input data serial-parallel converter circuit 26 becomes "1000" and the input to the eight-bit adder circuit 22 becomes "00001000" (08 in the hexadecimal representation). The bits $B_5$ to $B_{10}$ of the output from the data latch 17 are delivered to the eight-bit adder circuit 22 to supply thereto another input (A0). In the eight-bit adder circuit 22, (08) and (A0) are added together to obtain a jump address <A8>, which is provided to the memory address latch 15. Along with this, data (049) $(B_{10}B_9B_8B_7B_6B_5XXB_4B_3B_2B_1 = $ "000001001001" in the binary representation) is read out of the decoding table memory 16 into the data latch 17. The least significant bit $B_1 = $ "1" indicates that this data is terminal data, that is, a terminal node has been reached to end the decoding operation. The data selectors 20 and 21 are switched by the decoding completion detector circuit 12 to their side b ("end"). Since the bit $B_4$ is "1", the data selector 29 is changed over to the MC side, that is, the output from the data selector 29 is entered as a makeup code into the run length output latch 31 to obtain "000001000000" in the binary representation, i.e. the run length "64", thus completing the decoding operation.

A data $B_3B_2 = $ "00" of the data latch 17 is provided to the initial bit number setting circuit 37, where the "00" is incremented by one to produce a value "1", which represents a difference between the fixed number of bits of input data "4" and the number of bits "3" of the data "000" which has not been used for the decoding of the input data "11011000". The value "1" is applied as an initial data to the input data counter 24. In this example, since the bit $B_4$ of the read out terminal data is "1", the decoding completion detector circuit 12 resets the memory address latch 15 while retaining the flip-flop 14 unchanged, that is, maintaining the white code decoding state. From the memory 16 is read out the data (000) into the data latch 17. Then, upon data input to the input data serial-parallel converter circuit 26, decoding of the next input data is performed in the same manner as in the case of the input "11011". In the case where the bit $B_4$ is "0" when the terminal data is read out, the decoding completion detector circuit 12 inverts the flip-flop 14 to change over the readout of the decoding table memory 16 to the black code table readout and resets the memory address latch 15. In the embodiment described above in connection with FIG. 8 and 10, the data is entered by steps of a fixed number of bits, four bits in this example, in the course of decoding, and those bits of the four-bit data entered which have not been employed for decoding, that is, the three bits "000" in the above example, are used for the next subsequent decoding. Accordingly, decoding is resumed using these three bits and one bit of the next data (the fixed number of bits, i.e. four bits in this example).

Figure 11:
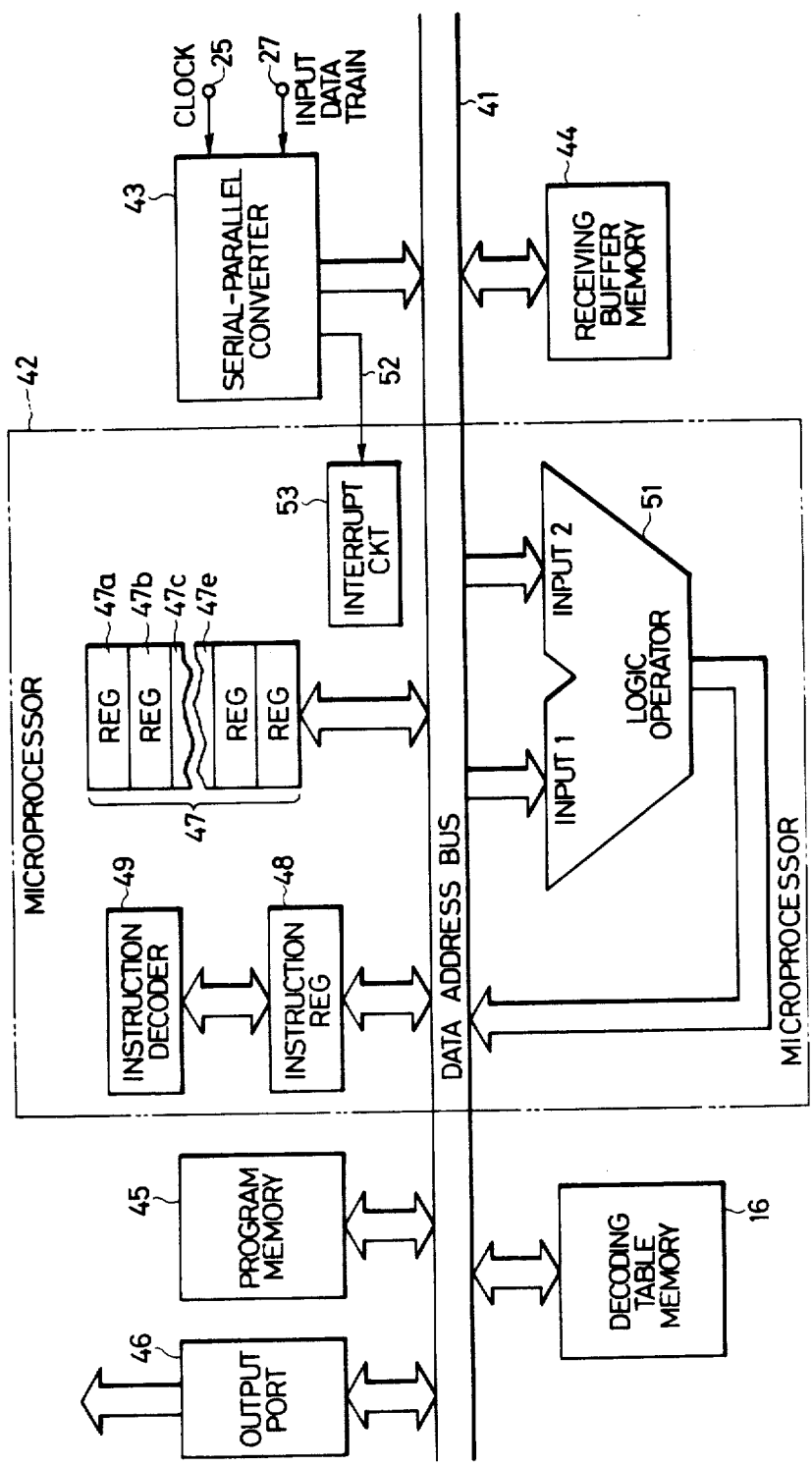
FIG. 11 is a block diagram representative of another embodiment of the decoding apparatus of the present invention employing the decoding table of FIG. 4 and constructed using a microprocessor.

The decoding apparatus of the present invention can be constituted not only by using the wired logic circuit of FIG. 7 and 10 but also by using a programmed general purpose circuit equipped with a memory access function and a data decision and calculating function, such as, for example, a microprocessor. A description will be given, with reference to FIG. 11, of an example of the decoding apparatus employing such a microprocessor used in conection with the decoding table of FIG. 4. To a bus 41 are connected a microprocessor 42, a serial-parallel converter circuit 43, a receiving buffer memory 44, a program memory 45, an output port 46 and the decoding table memory 16. In the decoding table memory 16 is stored the decoding table of FIG. 4, that is, the data represented by (XX) is stored at each address represented by <XX>. The microprocessor 42 has a plurality of general registers 47, accesses the program memory 45 in a sequential order to enter the read out instructions into an instruction register 48, decodes them in a decoder 49 and executes various input/output control, operations and decisions based on the decoded results. The logic operations of addition and decision are conducted by an operator 51 in connection with data of the general register 47. The results of the operations are stored in the general register 47. The decoding table memory 16 and the program memory 46 may be formed as a single memory. An input code train is entered into the serial-parallel converter circuit 43 from the lead 27. Upon each application of, for example, eight bits, an interrupt signal is applied via an interrupt line 52 to an interrupt circuit 53 of the microprocessor 42. When supplied with the interrupt signal, the microprocessor 42 stores an eight-bit serial data from the serial-parallel converter circuit 43 in the receiving buffer memory 44. The output port 46 is to deliver decoded results.

Figure 12:
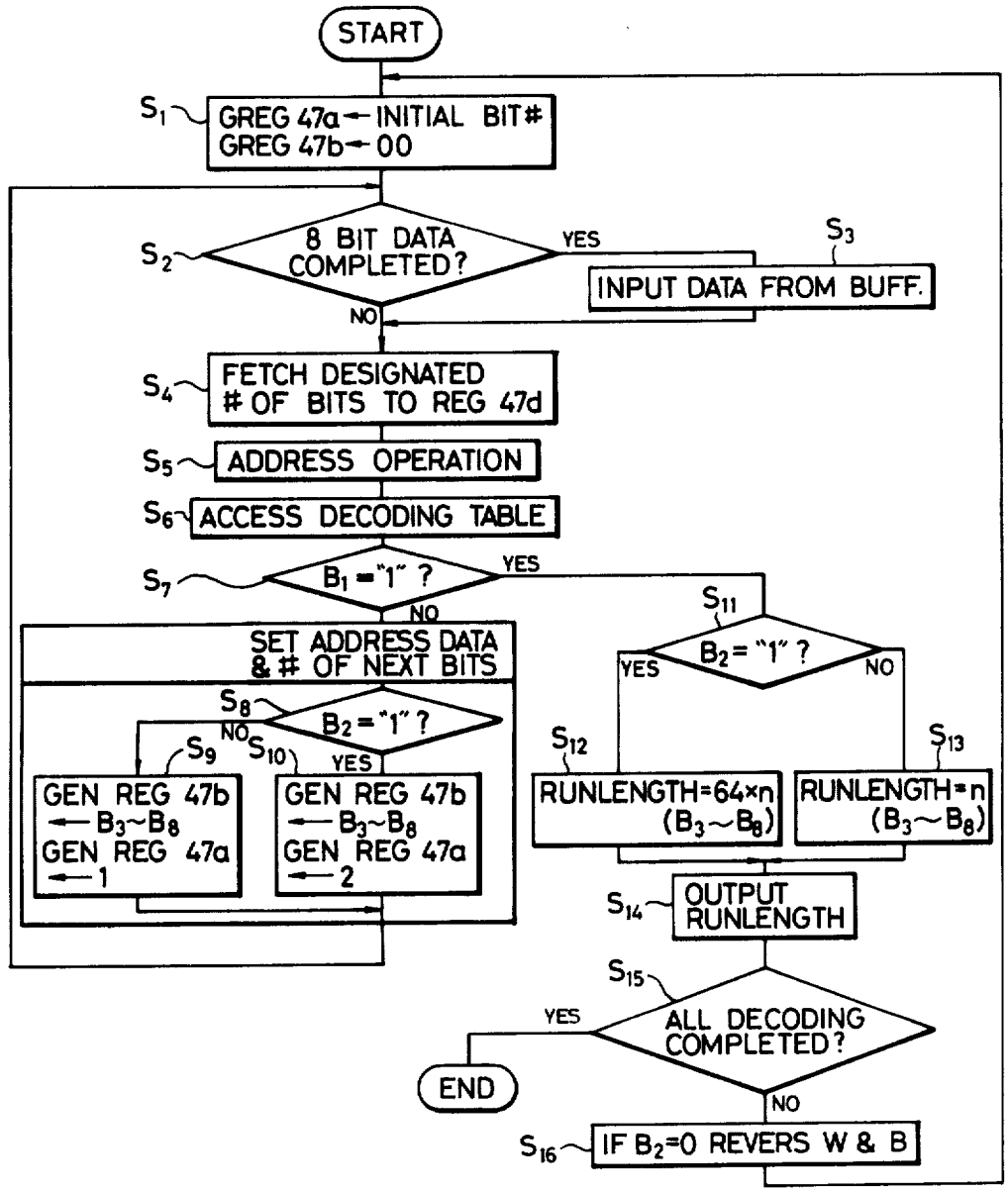
FIG. 12 is a flowchart showing an example of the operation of the decoding apparatus illustrated in FIG. 11.

Referring now to a flowchart of FIG. 12, an example of the operation of the abovesaid decoding apparatus will be described. The operation starts with a step $S_1$ in which the number of initial input bits, that is, the number of bits to be entered first from the input code train, "4" in this example, is set in a general register 47a and an initial address data for the decoding table memory 16, i.e. (00) in this example, is set in a general register 47b. In the next step $S_2$ it is checked whether, for example, all bits of the eight-bit input code entered into a general register 47c from the receiving buffer memory 44 has been used or not. In the case where the input code has already been used, the operation proceeds to a step $S_3$, in which the next eight-bit data is entered from the receiving buffer memory 44 into the general register 47c. In a step $S_4$ the data corresponding to the number of input bits "4" set in the register 47a in the step $S_1$ is transferred from the register 47c to a general register 47d. In a step $S_5$ the data thus transferred to the general register 47d and the initial address data (00) set in the register 47b in the step $S_1$ are added together to obtain an address. This address is used to access the decoding table memory 16 in a step $S_6$. In a step $S_7$ it is checked whether the least significant bit $B_1$ of the data read out from the decoding table memory 16 is "1" or not. Where the bit $B_1$ is not "1", the read out data is an intermediate data and the next address data and the number of input code bits to be entered next are set. That is, in the example described previously, it is checked in the step $S_6$ whether the bit $B_2$ of the read out data is "1" or not. If the bit $B_2$ is not "1", then the number of input code bits to be entered next is "1" and, in a step $S_9$, the bits $B_3$ to $B_8$ of the data read out from the decoding table memory 16 are set as an address data in the general register 47b and, at the same time, the number of input code bits "1" is set in the general register 47a. In the event that it is decided in a step $S_8$ that the bit $B_2$ is "1", the number of input code bits to be entered next is "2" and, in a step $S_{10}$, the bits $B_3$ to $B_8$ of the read out data are loaded in the general register 47b and, at the same time, the number of the next input code bits "2" is loaded in the general register 47a. After the step $S_9$ or $S_{10}$ the operation returns to the step $S_2$ to repeat the abovesaid procedure.

When it is decided in the step $S_7$ that the least significant bit $B_1$ is "1", the data read out from the decoding table memory 16 is a terminal data and the operation shifts to a step $S_{11}$, in which it is checked whether the bit $B_2$ of the data is "1" or not. If it is decided that the bit $B_2$ is "1", the data is a makeup code and n (a decimal number) represented by the bits $B_3$ to $B_8$ of the data must be multiplied by 64 to obtain the run length (step $S_{12}$). In the case where it is decided in step $S_{11}$ that the least significant bit $B_1$ is "0" and the read out data is a terminating code, the bits $B_3$ to $B_8$ of the data are obtained as the run length in a step $S_{13}$. The decoded result in the step $S_{12}$ or $S_{13}$ is delivered as a decoded output from the output port 46 (FIG. 11) in a step $S_{14}$. Next, it is checked in a step $S_{15}$ whether the decoding has entirely been completed or not. This may be decided based on the input code data or decoded data as is the case with the prior art. When it is decided that the decoding has not been completed yet, the operation proceeds to a step $S_{16}$, in which when it is decided that the decoded code is a terminating code, that is, when it is decided in the step $S_{11}$ that the bit $B_2$ is "0", the next decoding operation is switched between the white code decoding and the black code decoding and vice versa, then the operation returns to the step $S_1$. In the case where it is decided in the step $S_{15}$ that the decoding has not been completed yet and the bit $B_2$ is "1" in the step $S_{11}$, the operation returns to the step $S_1$ without passing through the step $S_{16}$.

Figure 13A:
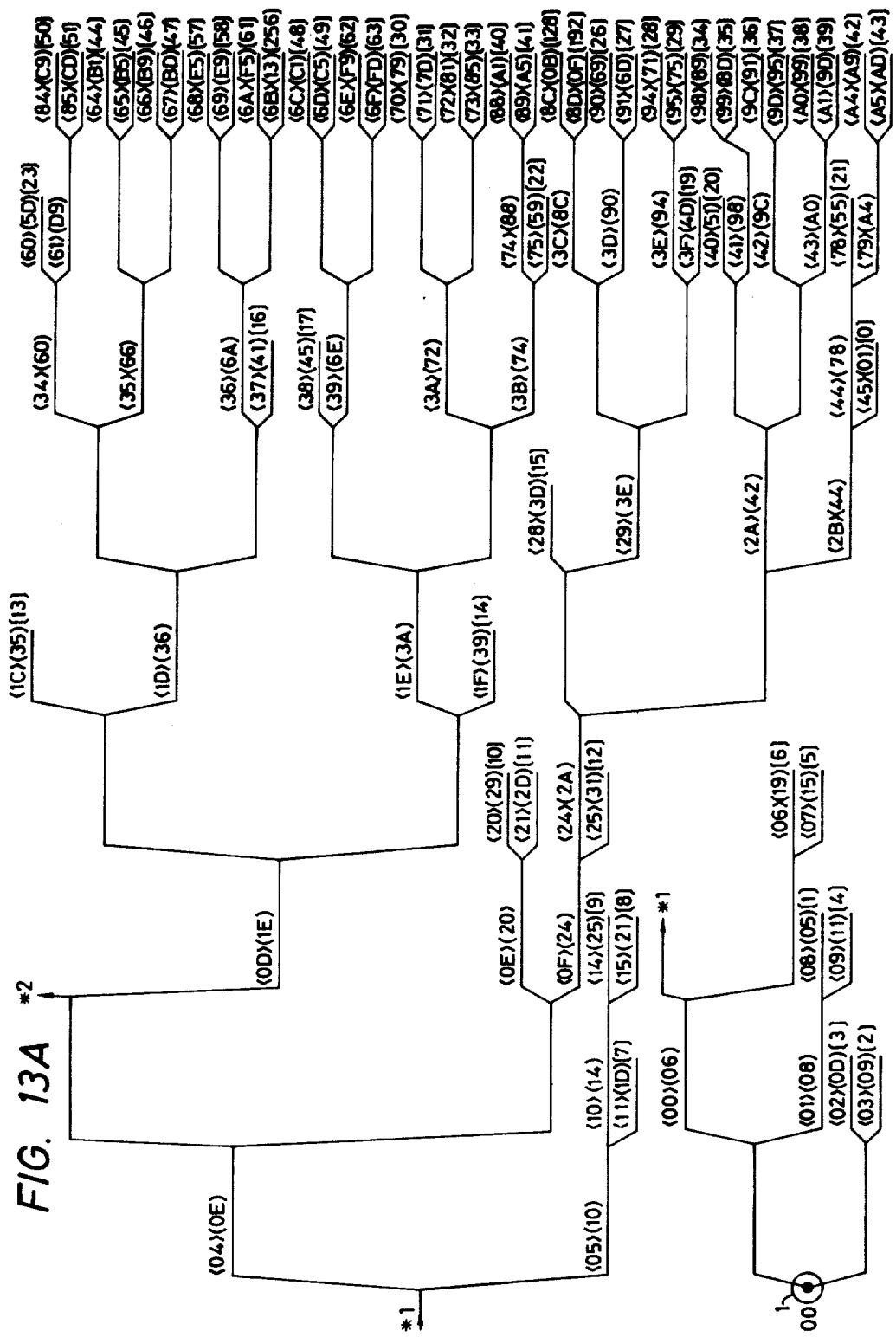
FIGS. 13A and 13B) is a diagram, corresponding to FIG. 4, showing an example of a decoding table for a black code.
Figure 13B:
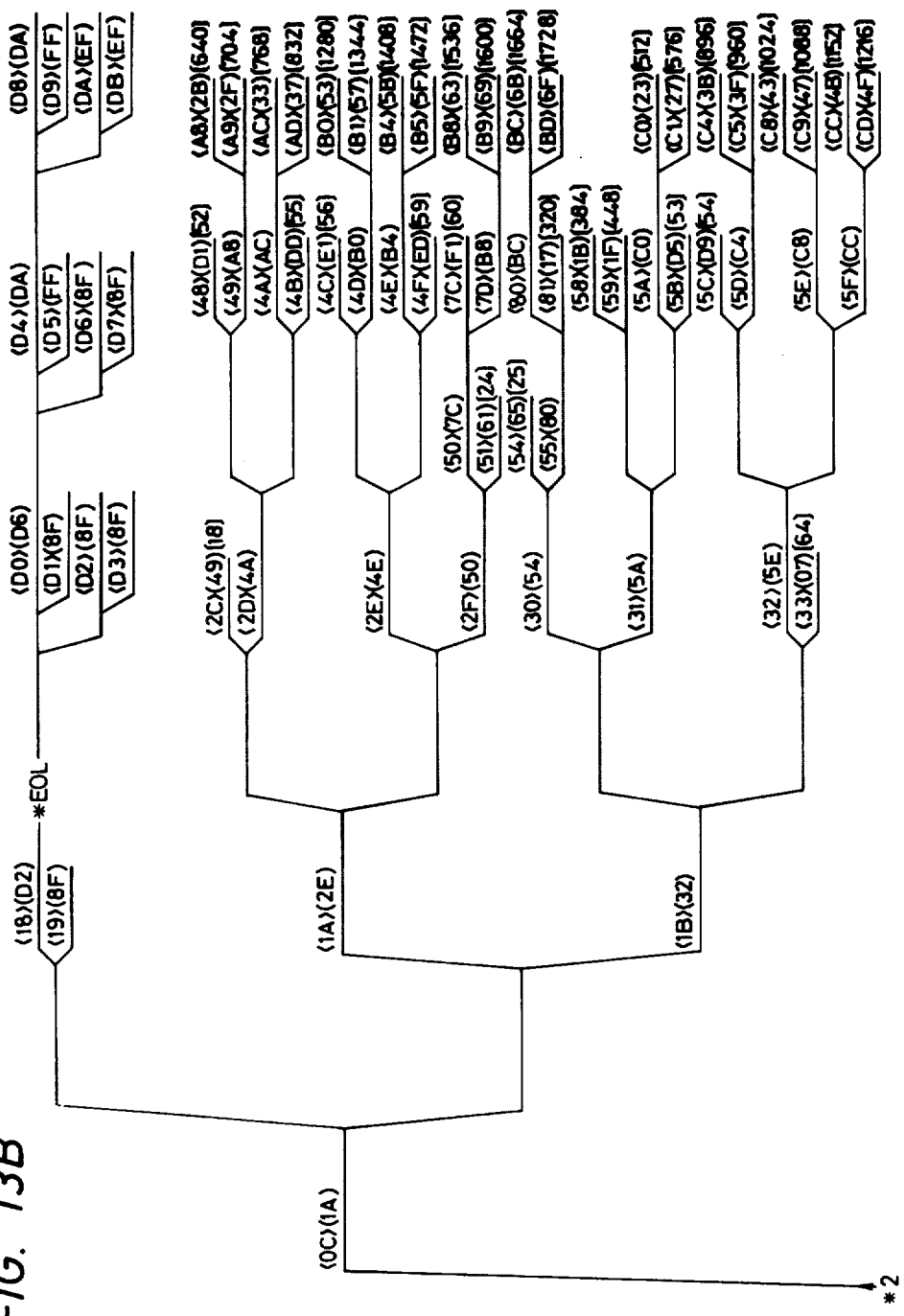

An example of the decoding table for black codes is shown in FIG. 13 in the same manner as in FIG. 4. As will be understood from this table, there is a terminal node at a branch second from the root 1, so that the number of input code bits to be entered first is "2". As will be appreciated from FIGS. 4 and 13, these decoding tables contain unused addresses (for example, <0A> and <0B> in FIG. 13) and consequently the decoding table memory is not efficiently utilized in this point. By forming the decoding table memory so that such useless addresses may not exist, the memory capacity can further be reduced.

As explained previously, the embodiment of FIG. 7 employs an 8-bit-word memory as the decoding table memory 16, and out of the eight bits of the data word, six bits ($B_3$–$B_8$) are used as the decoded result information or the data for determining the address to be accessed next, one bit ($B_1$) is used to decide whether the read out data is decoded result data or a next address data, and the remaining one bit ($B_2$) is provided for determining the number of bits to be entered next, which allows only two selectable states "0" and "1" corresponding to any two different values, i.e., in this case, one and two. It is, however, apparent that if the number of bits to be entered, first, for each input code is two or one instead of four, then there is no need for the initial data memory 23. Alternatively, if there are provided a plurality of bits, say, two bits in a data word for designation of the number of bits to be entered, then four selective states "00", "01", "10" and "11" are available, three of which can be used to designate the values one, two and four stored in the data memory 36, respectively, thus allowing omission of the initial data memory 23 as well as the other associated elements. Furthermore, if there are three bits in a data word, it is possible to express, directly, any of the values one (001), two (010) and four (100), thus allowing omission of both the initial data memory 23 and the data memory 36, and supply of the value directly to the input data counter 24. In the latter two cases, the length of the data word itself must be increased.

Figure 14:
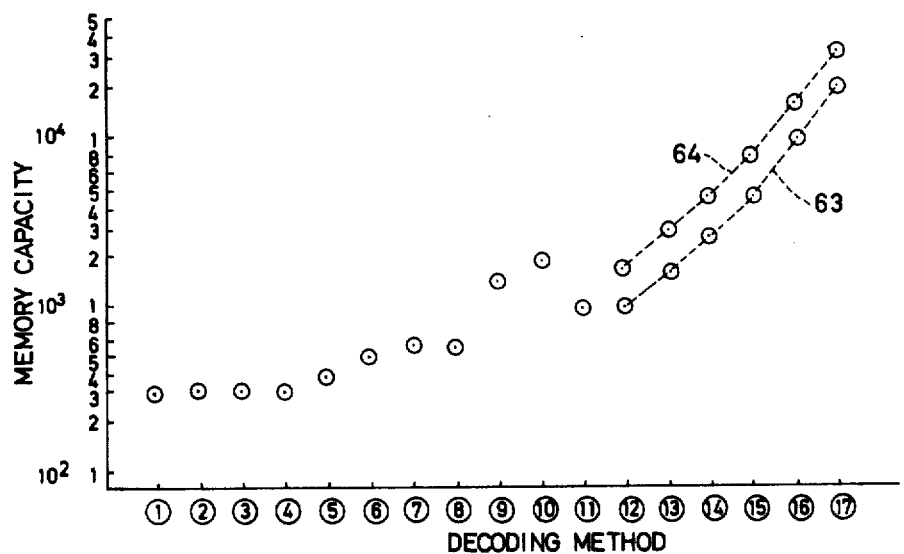
FIG. 14 is a graph showing the relationships between various decoding systems and decoding table memory capacities required therefor.

With the decoding apparatus of the present invention described above, it is possible to decrease the required capacity of the decoding table memory. FIG. 14 shows memory capacities required for various decoding methods. The abscissa represents the decoding methods. ①  shows a decoding method which employs a code table and in which codes of the stored code tables are sequentially generated for comparison with an input code to obtain a decoded result based on coincidence between them. ②, ③ and ④ each show the case of using the method described previously in connection with FIG. 7, ② being the case where the number of input code bits is selected to be a preferred value for each node of the code tree, ③ being the case where the number of bits to be entered at one time is selected to be any of "1", "2" and "4" in accordance with the information read from the decoding table memory 16, and ④ being the case where the number of bits to be entered at one time is selected to be "1" or "2". ⑤ shows the bit-by-bit decoding method described previously with regard to FIG. 1. ⑥ to ⑩ each show the case of employing the decoding method described previously with respect to FIG. 10. In 6 to 10, the fixed number of bits to be entered at one time is selected to be "2", "3", "4", "5" and "6", respectively. ⑪ to ⑰ each show the case of employing the decoding method referred to previously in respect of FIG. 3. In ⑪ to ⑰, the number of bits to be entered at one time is selected to be "7", "8", "9", "10", "11", "12" and "13", respectively. The ordinate represents the storage capacity. The curve 63 indicates the case of employing a 16-bit word memory as the decoding table memory 16 and the curve 64 depicts the case of using an eight-bit word memory. From FIG. 14 it is apparent that the storage capacity required for the apparatus of FIG. 7 is equal to the minimum of the storage capacities required in the prior art methods, and that, moreover, it is about ⅓ of the smallest capacity that is required when using the method of FIG. 3. In the apparatus illustrated in FIG. 10, an increase in the number of bits to be entered first causes an increase in the storage capacity required but it is less than or substantially equal to the storage capacity needed in the case of FIG. 3.

Figure 15:
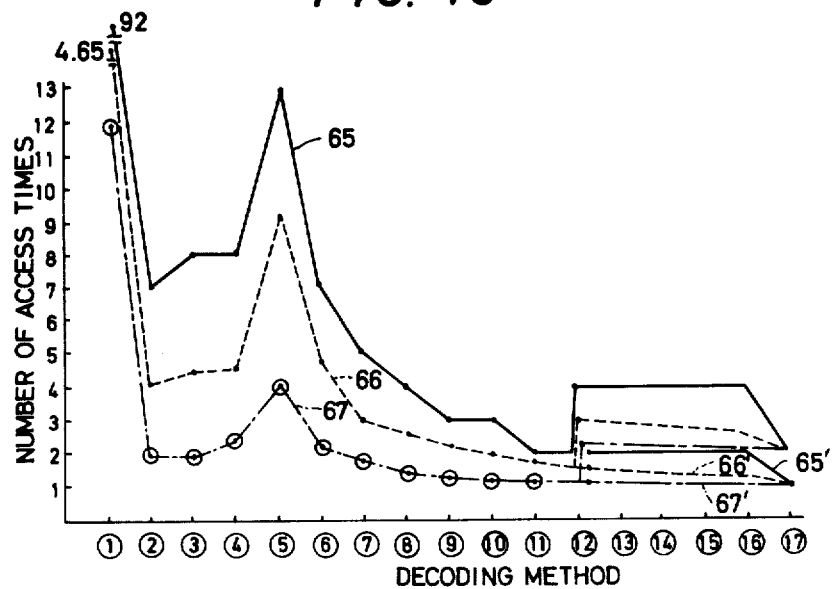
FIG. 15 is a table showing the relationships between various decoding systems and the required times to access the decoding table memories.

FIG. 15 shows the memory access times required in the various decoding methods. The abscissa represents the same methods as mentioned above in respect of FIG. 14 and the ordinate represents the number of accesses. The curves 65 and 65' each indicate maximum access times, the curves 66 and 66' indicate mean access times, and the curves 67 and 67' indicate weighted mean access times taking into account the probability of occurrence of each codes; the curves 65', 66' and 67' showing the cases of employing a 16-bit word memory and the others the cases of employing eight-bit word memory. From FIG. 15 it will be appreciated that the access times needed in the apparatus of the present invention is far smaller than the number of accesses needed in the case of the bit-by-bit decoding method ⑤ and only slightly larger than in the case of the conventional apparatus of FIG. 3. In terms of the weighted mean access times which represents the most practical values, the apparatus of the present invention is very close to the apparatus of FIG. 3.

FIG. 16 shows, based on the above facts, the capacity of the decoding table memory and the access times in each of various apparatus, with the capacity of the decoding table memory and the number of accesses in the apparatus of FIG. 7 being respectively represented by 1.

As has been described in the foregoing, according to the present invention, the number of code bits to be entered next is determined by reading out the decoding table memory, an addition or like operation of the data read out from the decoding table memory and the entered code is performed to determine the address to be accessed next and then the same decoding memory is accessed using the address. This decreases the memory capacity and the number of accesses, and hence permits high-speed decoding with small-scale hardware. In addition, according to the embodiment of FIG. 7, when decoding one code, the leading bit of the input code becomes the first bit of the next code, facilitating the subsequent processing.

While in the foregoing the address to be accessed next is obtained by adding together the data read out from the decoding table memory and the input code, it is also possible to obtain this address by other operations such as subtraction and multiplication. In the foregoing, since the embodiments of the present invention have been described as being applied to the decoding of the modified Huffman code, the information representing the kind of code, that is, whether the code is a makeup or terminating code, is included in the terminal code, but in the case of a mere Huffman code, the information indicating the kind of code is not necessary. Furthermore, the present invention is also applicable to the decoding of variable-length codes generally represented by a code tree.

It will be apparent that many modifications and variations may be effected without departing from the scope of the novel concepts of this invention.

What is claimed is:

1. An apparatus for decoding variable length codes represented by a code tree comprising:
   data input means for receiving an input code train;
   a decoding table memory having address locations each for storing terminal data including a bit area indicating completion of decoding and a bit area indicating decoded result information, said decoding table memory also having address locations each for storing intermediate data including a bit area indicating incompletion of decoding, a bit area indicating the number of bits to be entered from the input code train, and a bit area indicating address information for determining an address of the decoding table memory to be accessed;
   readout means for accessing said decoding table memory to read out data therefrom;
   means for detecting the information, in the data read out from said decoding table memory, which indicates completion or incompletion of decoding, said detecting means being operative to determine whether the read out data is terminal data or intermediate data;

output means for receiving the decoded result information read out from said decoding table memory and for outputting decoded data when the read out data from said decoding table memory is determined by said detecting means to be terminal data;

input control means for controlling the number of bits to be entered by said data input means from the input code train;

address operating means, responsive to a determination by said detecting means that the read out data is intermediate data, for processing the information of the intermediate data and the data entered by said data input means to produce an address of said decoding table memory to be accessed next; and selector means, responsive to a determination by said detecting means that the read out data is terminal data, for supplying to said output means the data in the bit area indicating the decoded result information, said selector means being responsive to a determination by said detecting means that the read out data is intermediate data for supplying to said address information.

2. A decoding apparatus according to claim 1 wherein the information indicating the number of bits to be entered is a variable number not exceeding the number of branches from a root or internal node to the nearest terminal node in the code tree.

3. A decoding apparatus according to claim 1 or 2 comprising an initial data memory for storing therein the number of bits to be entered first for each code of the input code train.

4. A decoding apparatus for decoding variable length codes represented by a code tree comprising:

data input means for receiving an input code train;

a decoding table memory having address locations each for storing terminal data including a bit area indicating completion of decoding, a bit area indicating decoded result information, and a bit area indicating the number of bits to be entered first for each code, said decoding table memory also having address locations each for storing intermediate data including a bit area indicating incompletion of decoding and a bit area indicating address information for determining an address of said decoding table memory to be accessed;

readout means for accessing said decoding table memory to read out data therefrom;

means for detecting the information in said read out data which indicates completion or incompletion of decoding, said detecting means being operative to determine whether the read out data is terminal data or intermediate data;

output means for receiving the decoded result information read out from said decoding table memory and for outputting decoded data when the read out data from said decoding table memory is determined by said detecting means to be terminal data;

input control means for controlling the number of bits to be entered by said data input means for the input code train;

a fixed data memory for supplying a predetermined fixed number m (m being an interger of at least 2) indicating the number of bits to be entered by said data input means to said input control means when the read out data is determined by said detecting means to be intermediate data;

address operating means, responsive to a determination by said detecting means that the read out data is intermediate data, for processing the information of the intermediate data and the data entered by said data input means to produce an address of said decoding table memory to be accessed next;

selector means, responsive to a determination by said detecting means that the read out data is terminal data, for supplying the data in the bit area indicating the decoded result information to said output means, said selector means being responsive to a determination by said detecting means that the read out data is intermediate data for supplying the data in the bit area indicating address information to said address operating means; and data setting means, responsive to a determination by said detecting means that the read out data is terminal data, for receiving data in the read out data which indicates the number of bits to be entered first and for setting said number into said input control means.

5. A decoding apparatus according to claim 1 or 4 wherein each of said address locations for storing terminal data includes a bit area indicating whether the decoded data is a terminating code or a make up code.

6. A decoding apparatus according to claim 5 wherein said output means comprises an output latch having a number of output terminals which are twice the number of bits in the bit area indicating the decoded result information, said output terminals respectively corresponding to binary weighted output bits, and changeover means for receiving the decoded result information from said decoding table memory through said selector means and for supplying the decoded result information to the output terminals corresponding to the lower order half of the output bits when the read out data is determined to be terminal data and the decoded data is a terminating code, and for supplying the decoded result information to the output terminals corresponding to the higher order half of the output bits when the read out data is determined to be terminal data and the decoded data is a make up code.

7. A decoding apparatus according to claim 1 or 4 wherein said bit area indicating the completion of decoding in the terminal data and said bit area indicating incompletion of decoding in the intermediate data are at the same bit location.

8. A decoding apparatus according to claim 1 or 4 wherein said bit area indicating decoded result information in the terminal data and said bit area indicating address information in the terminal data are at the same bit locations.

9. A decoding apparatus according to claim 4 wherein the information indicating the number of bits to be entered first is $L-(n-1)m$, where L is the code length decoded at that time and n is the number of accesses made to the decoding table memory for the decoding.

10. A decoding apparatus according to claim 1 or 4 wherein the terminal data includes information indicating the kind of a decoded code.

11. A decoding apparatus according to claim 1 or 4 wherein the address operating means is means for performing an add operation.

* * * * *